United States Patent [19]
Uratani et al.

[11] Patent Number: 5,353,251
[45] Date of Patent: Oct. 4, 1994

[54] MEMORY CELL CIRCUIT WITH SINGLE BIT LINE LATCH

[75] Inventors: Munehiro Uratani, Yamatokoriyama; Aoi Kitaura, Tenri, both of Japan

[73] Assignee: Sharp Kabushiki Kaisha, Osaka, Japan

[21] Appl. No.: 123,434

[22] Filed: Sep. 16, 1993

[30] Foreign Application Priority Data

Sep. 21, 1992 [JP] Japan .................. 4-250955

[51] Int. Cl.5 .................................. G11C 7/00
[52] U.S. Cl. ................. 365/189.05; 365/154; 365/156
[58] Field of Search ............... 365/189.05, 154, 156

[56] References Cited

U.S. PATENT DOCUMENTS

| | | | |
|---|---|---|---|
| 3,493,786 | 2/1970 | Ahrons et al. | 365/156 |
| 3,521,242 | 7/1970 | Katz | 365/156 |
| 3,747,077 | 7/1973 | Goser | 365/154 |
| 3,813,653 | 5/1974 | Smith et al. | 365/156 |
| 3,964,031 | 6/1976 | Eaton | 365/156 |
| 3,968,479 | 7/1976 | Goser | 365/156 |
| 4,281,400 | 7/1981 | Schanzer et al. | 365/156 |
| 4,348,601 | 9/1982 | Kitamura | 365/189.05 |
| 4,380,055 | 4/1983 | Larson | 365/154 |
| 4,393,471 | 7/1983 | Hart et al. | 365/154 |
| 4,404,657 | 9/1983 | Furuyama et al. | 365/154 |
| 4,441,169 | 4/1984 | Sasaki et al. | 365/154 |
| 4,447,892 | 5/1984 | Zibu | 365/156 |
| 4,536,859 | 8/1985 | Kamuro | 365/156 |
| 4,660,177 | 4/1987 | O'Connor | 365/156 |
| 4,724,530 | 2/1988 | Dingwall | 365/156 |
| 4,760,557 | 7/1988 | Stewart et al. | 365/156 |
| 4,792,924 | 12/1988 | Rubinstein | 365/154 |
| 4,833,644 | 5/1989 | Plus et al. | 365/154 |
| 4,872,141 | 10/1989 | Plus et al. | 365/156 |
| 5,105,384 | 4/1992 | Noguchi et al. | 365/189.05 |
| 5,257,239 | 10/1993 | Guo et al. | 365/189.05 |
| 5,278,459 | 1/1994 | Matsui et al. | 365/154 |

FOREIGN PATENT DOCUMENTS 3-34191 2/1991 Japan .

OTHER PUBLICATIONS

O'Connor, K. J., "The twin-port memory cell" *IEEE Journal of Solid-State Circuits* (Oct. 1987) vol. sc-22, No. 5, pp. 712–720.

Primary Examiner—Joseph E. Clawson, Jr.
Attorney, Agent, or Firm—Morrison & Foerster

[57] ABSTRACT

A memory cell circuit for a CMOS static RAM is provided, which includes a latch portion for holding logic high or logic low data depending on the potential of a single bit line, and a transfer gate having a first terminal connected to the latch portion and a second terminal connected to the single bit line, the transfer gate electrically connecting or disconnecting the first and second terminals in response to a selection signal, wherein the transfer gate includes a first transistor and a second transistor connected in parallel between the first and second terminals, both of the first and second transistors being activated at a data write operation, while one of the first and second transistors being activated at a data read operation.

15 Claims, 6 Drawing Sheets

MEMORY CELL CIRCUIT WITH SINGLE BIT LINE LATCH

BACKGROUND OF THE INVENTION

1. Field of the Invention

The present invention relates to a memory cell circuit, and more particularly to a memory cell circuit for a complementary metal oxide semiconductor (CMOS) static random access memory (static RAM or SRAM).

2. Description of the Related Art

Three conventional memory cell circuits for the CMOS static RAM will be described.

Conventional Circuit 1

Figure 6:
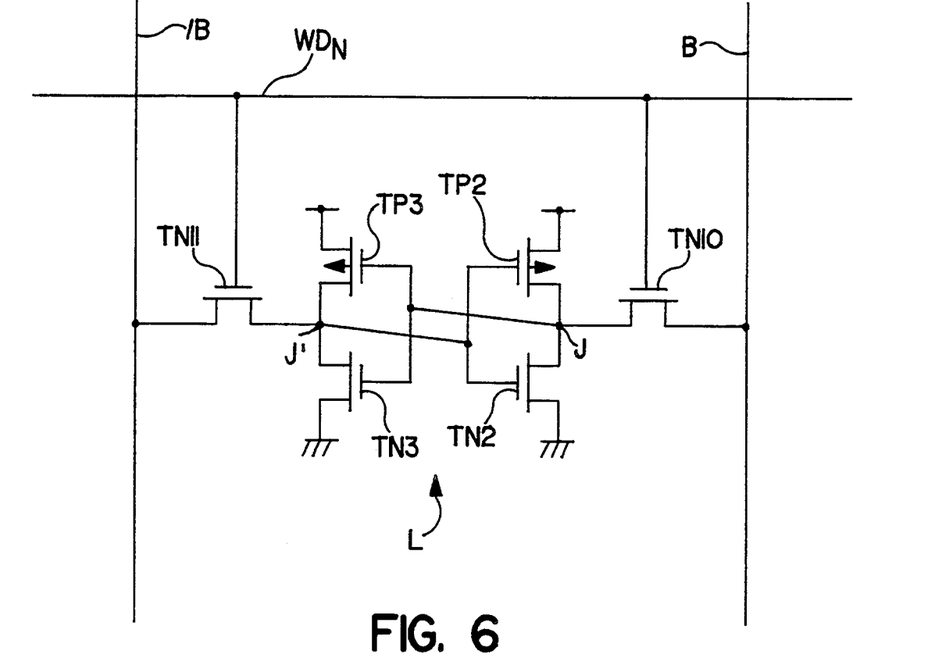
FIG. 6 is a circuit diagram of a conventional memory cell circuit.

A first conventional memory cell circuit shown in FIG. 6 includes a latch portion L and two n-channel MOS transistors TN10 and TN11 as transfer gates disposed between bit lines B and/B and output terminals J and J' of the latch portion L, respectively. The latch portion L includes two inverters whose input and output terminals are cross-coupled. One of the inverters includes a p-channel MOS transistor TP2 and an n-channel MOS transistor TN2 connected in series between a power source and the ground. The other includes a p-channel MOS transistor TP3 and an n-channel MOS transistor TN3 connected in series between the power source and the ground. The output terminals J and J' of the latch portion L hold data of a logic high (HIGH) or logic low (LOW) level. The memory cell circuit 1 requires the two bit lines B and /B and one word line $WD_N$ connected to the gates of the transistors TN10 and TN11.

When data is written to the memory cell circuit (a write operation), the potential of the word line $WD_N$ is raised to the HIGH level. This activates the transistors TN10 and TN11. ("Activating a transistor" as used herein means "turning on the transistor". Likewise, "inactivating a transistor" means "turning off the transistor".) Under this state, one of the bit lines B and /B is driven to the LOW level while the other to the HIGH level depending on the data (ZERO or ONE) to be written. As a result, the data is written to the latch portion L. When the data is read from the memory cell (a read operation), the potential of the word line $WD_N$ is raised to the HIGH level, activating the transistors TN10 and TN11. This results in producing a potential difference between the bit lines B and /B depending on the data (ZERO or ONE) held in the latch portion L. This potential difference is amplified by a sense amplifier (not shown) so as to read the data.

This conventional memory cell circuit 1 provides a comparatively large margin for the write and read operations. For this reason, the memory cell circuit 1 is suitable for mass production and thus has been widely used.

The conventional memory cell circuit 1 has a problem as follows: since the memory cell circuit 1 needs two bit lines B and/B which individually consume electric power, the power consumption required for the entire memory device becomes large. In general, in order to ensure the stable operation of the memory cell circuit, the potential of the bit lines is raised high (to a level near a source voltage) before the start of access operations (the write and read operations). This allows current to flow through the bit lines B and /B by precharging for a clock-operated synchronous circuit, or by a pull-up transistor for an asynchronous circuit without the use of a clock. This current flow increases the power consumption, and thus more power is consumed by the memory cell circuit using two bit lines. Moreover, according to the memory cell circuit 1, current always flows through one of the bit lines B and/B during the read operation whichever data (ZERO or ONE) is held in the latch portion L. This also causes an increase in the power consumption.

Conventional Circuit 2

Figure 7:
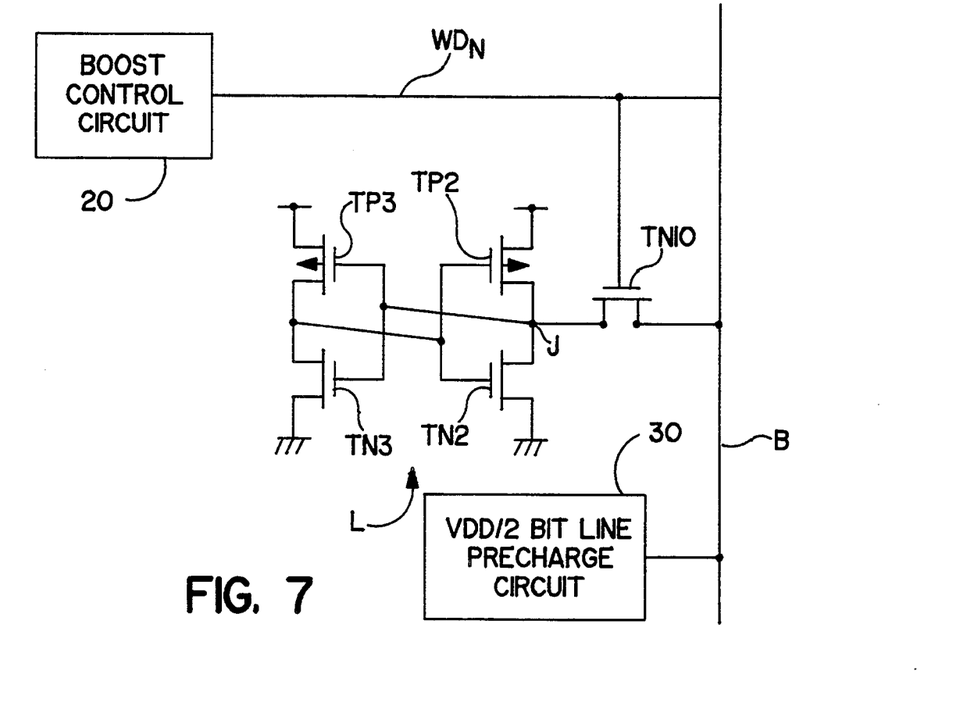
FIG. 7 is a circuit diagram of another conventional memory cell circuit.

A second conventional memory cell circuit shown in FIG. 7 includes a latch portion L and an n-channel MOS transistor TN10 as a transfer gate disposed between an output terminal J of the latch portion L and a bit line B. The memory cell circuit 2 requires the single bit line B and a single word line $WD_N$ connected to the gate of the transistor TN10. Since the memory cell circuit 2 requires only one bit line B, the power consumption of the bit line can be reduced by half compared with the conventional memory cell circuit 1 using two bit lines.

The conventional memory cell circuit 2 has a problem as follows: since the transfer gate for connecting the bit line B and the output terminal J of the latch portion L includes only the n-channel MOS transistor TN10, the resistance of the transistor TN10 generated when the transistor TN10 is activated (hereinafter, referred to as an "ON resistance") is influential during the write operation so that the correct writing of the HIGH level to the latch portion L (i.e., holding of the HIGH level on the output terminal J) may be disturbed. In order to reduce the ON resistance of the transistor TN10, it is necessary to raise the potential level of the word line $WD_N$ above the source voltage. For this purpose, a boost control circuit 20 is connected to the word line $WD_N$. The memory cell circuit 2 also requires a precharge circuit 30 for precharging the bit line B to a half-VDD level (a mean level between the source potential VDD and the ground potential GND) to ensure a stable read operation.

Thus, the memory cell circuit 2 additionally requires the circuits 20 and 30 which are comparatively complicated. It also provides a limited margin for the operations against a variation in the manufacturing conditions and the source voltage. For this reason, the memory cell circuit 2 is not suitable for mass production and thus has not been used in practice.

Conventional Circuit 3

Figure 8:
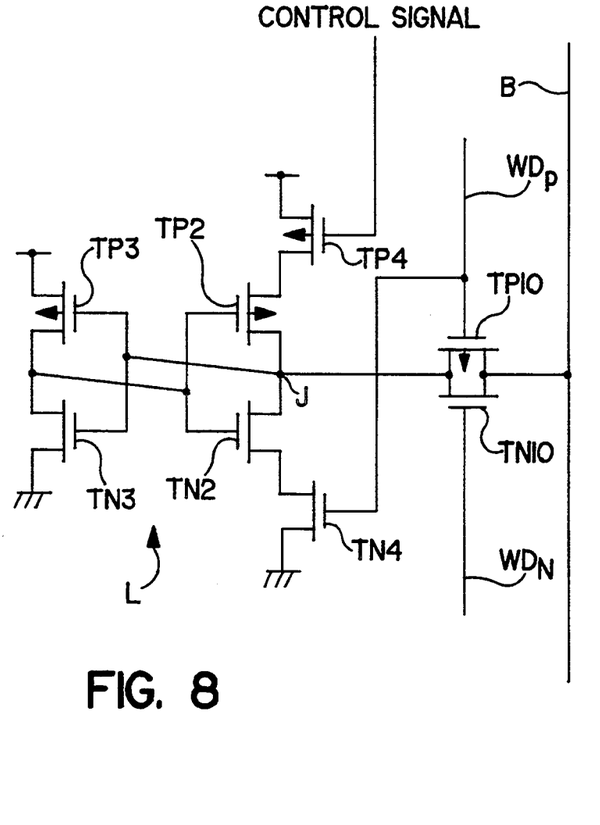
FIG. 8 is a circuit diagram of yet another conventional memory cell circuit.

A third conventional memory cell circuit shown in FIG. 8 includes a latch portion L and a p-channel MOS transistor TP10 and a transfer gate having an n-channel MOS transistor TN10 connected in parallel between an output terminal J of the latch portion L and a bit line B. The memory cell circuit 3 requires the single bit line B and word lines $WD_P$ and $WD_N$ connected to the gates of the transistors TP10 and TN10, respectively. In addition to the above-described configuration of the conventional memory cell circuits 1 and 2, the memory cell circuit 3 further includes a p-channel transistor TP4 and an n-channel transistor TN4 connected to one of inverters constituting the latch portion L. The word lines $WD_P$ and $WD_N$ are driven so as to be complementary to each other (i.e., $WD_P = /WD_N$). Accordingly, during the access operations to the memory cell, the transistors TP10 and TN10 are activated while the transistor TN4 is inactivated. A control signal line connected to the transistor TP4 receives part of a system clock so as to effect refreshing for retaining data stored in the memory cell. With the additional transistors TP4 and TN4, the memory cell circuit 3 ensures a large margin for the access operations. More specifically, according to the memory cell circuit 3, when both the transistors TP10 and TN10 are activated during the access operations, the transistor TN4 is inactivated. This prevents the latch portion L from being inverted during the read operation under the direct influence of the potential of the bit line B.

The memory cell circuit 3 is disadvantageous in that it requires a total of eight transistors with the two transistors TP4 and TN4 added to the six transistors included in the conventional memory cell circuit 1 shown in FIG. 6. This enlarges the size of the memory cell circuit.

SUMMARY OF THE INVENTION

The memory cell circuit of this invention comprises: latch means for holding logic high or logic low data depending on the potential of a single bit line: and transfer gate means having a first terminal connected to said latch means and a second terminal connected to said single bit line, said transfer gate means electrically connecting or disconnecting said first terminal and said second terminal in response to a selection signal, wherein said transfer gate means includes a first transistor and a second transistor connected in parallel between said first terminal and said second terminal, both of said first transistor and said second transistor being activated during a data write operation, while one of said first transistor and said second transistor being activated during a data read operation.

According to the memory cell circuit of the present invention which uses a single bit line, the power consumption can be reduced by half compared with a conventional memory cell circuit as shown in FIG. 6.

Further, the transfer gate disposed between the bit line and the latch portion includes the p-channel MOS transistor and the n-channel MOS transistor connected in parallel. With this configuration, both of the transistors are activated during the write operation, thereby reducing the ON resistance of the transfer gate. As a result, the writing of HIGH or LOW level data to the latch portion is smoothly conducted. During the read operation, only one of the transistors of the transfer gate is activated, thereby preventing the latch portion from receiving the direct influence of the potential of the bit line. Thus, the margin for both the write and read operations can be large, allowing for the mass-production of the memory cell circuit.

Thus, the invention described herein makes possible the advantage of providing a memory cell circuit which provides a large margin for the access operations to allow for mass production and can be operated with a reduced power consumption, not increasing the size thereof.

This and other advantages of the present invention will become apparent to those skilled in the art upon reading and understanding the following detailed description with reference to the accompanying figures.

DESCRIPTION OF THE PREFERRED EMBODIMENTS

The present invention will be described by way of example with reference to the attached drawings.

Figure 1:
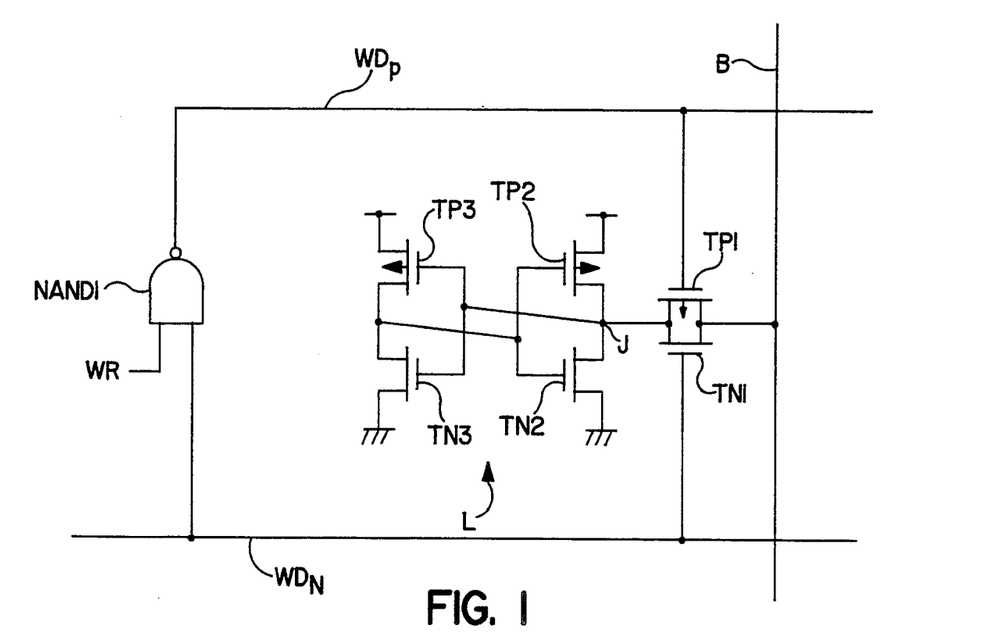
FIG. 1 is a circuit diagram of a memory cell circuit according to the present invention.

Referring to FIG. 1, a memory cell circuit of the present invention includes a latch portion L and a transfer gate having a p-channel MOS transistor TP1 and an n-channel MOS transistor TN1 connected in parallel between an output terminal J of the latch portion L and a bit line B. The latch portion L includes two inverters whose input and output terminals are cross-linked. One of the inverters includes a p-channel MOS transistor TP2 and an n-channel MOS transistor TN2 connected in series between a power source and the ground. The other includes a p-channel MOS transistor TP3 and an n-channel MOS transistor TN3 connected in series between the power source and the ground. The output terminal J of the latch portion L holds HIGH or LOW data. The memory cell circuit of the present invention requires the single bit line B and two word lines $WD_P$ and $WD_N$ connected to the gates of the p-channel transistor TP1 and the n-channel transistor TN1, respectively. The word line $WD_P$ is driven in a complementary relationship with the word line $WD_N$ through an NAND circuit NAND1 during the write operation, i.e., when a write mode signal WR is HIGH. On the other hand, the word line $WD_P$ is driven to the HIGH level during the read operation and when the memory cell is not selected (a waiting period), i.e., when the write mode signal WR is LOW.

Referring to FIG. 1, during the write operation, when the potential of the word line $WD_N$ is raised to the HIGH level, the word line $WD_P$ is driven to the LOW level through the NAND circuit NAND1. Accordingly, both the transistors TP1 and TN1 of the transfer gate are simultaneously activated. Under this state, the bit line B is driven to the HIGH level or to the LOW level by a write circuit (not shown), resulting in the writing of data to the latch portion L. Since both the transistors TP1 and TN1 are activated, the ON resistance of the transfer gate can be reduced. As a result, the writing of HIGH or LOW data from the bit line B to the latch portion L is smoothly conducted.

During the read operation, when the word line $WD_N$ is in the HIGH level, the word line $WD_P$ is driven to the HIGH level through the NAND circuit NAND1. Accordingly, only the n-channel transistor TN1 of the transfer gate is activated, while the p-channel transistor TP1 is inactivated. Under this state, the potential of the bit line B which changes depending on the data (ZERO or ONE) held on the output terminal J of the latch portion L is amplified by a sense amplifier (not shown) so as to read the data. Since only one transistor of the transfer gate, i.e., the transistor TN1 in this case, is activated, the latch portion L is less influenced by the potential of the bit line B.

As described above, the memory cell circuit can provide a large margin for both the write and read operations. This allows for the mass-production of the memory cell circuit.

In the above description, only the word line $WD_N$ is made active during the read operation. However, only the word line $WD_P$ may be made active in order to obtain the result as described above.

In the waiting (non-selection) period, the word line $WD_N$ is set to the LOW level, and thus the word line $WD_P$ is driven to the HIGH level. Accordingly, both the p-channel transistor TP1 and the n-channel transistor TN1 as the transfer gate are inactivated.

Table 1 summarizes the above description.

TABLE 1

| Mode | $WD_N$ | $WD_P$ | TP1 | TN1 | B |
|---|---|---|---|---|---|
| Read cycle | HIGH (LOW) | HIGH (LOW) | OFF (ON) | ON (OFF) | Driven by memory cell transistor |
| Write cycle | HIGH | LOW | ON | ON | Forced to VDD level (HIGH write) or GND level (LOW write) |
| Non-selection | LOW | HIGH | OFF | OFF | Raised to HIGH by pull-up transistor or floating |

The number of transistors constituting the memory cell circuit of the present invention is six, and the total number of word lines and bit lines required for the memory cell circuit is three. These are the same as those used and required for the conventional memory cell circuit 1 shown in FIG. 6. This indicates that the size of the memory cell circuit of the present invention can be as small as that of the conventional memory cell circuit. In practice, under certain conditions, the memory cell circuit (six transistors and one bit line) of the present invention consumes an electric power of 0.65 mW, while a conventional memory cell circuit (six transistors + two bit lines) consumes an electric power of 1.04 mW.

The operation of the memory cell circuit of the present invention was simulated using a circuit simulator SPICE. As a result, it was confirmed that the memory cell circuit of the present invention was operable with a reduced power consumption and provided a large margin for the access operations.

Figure 2:
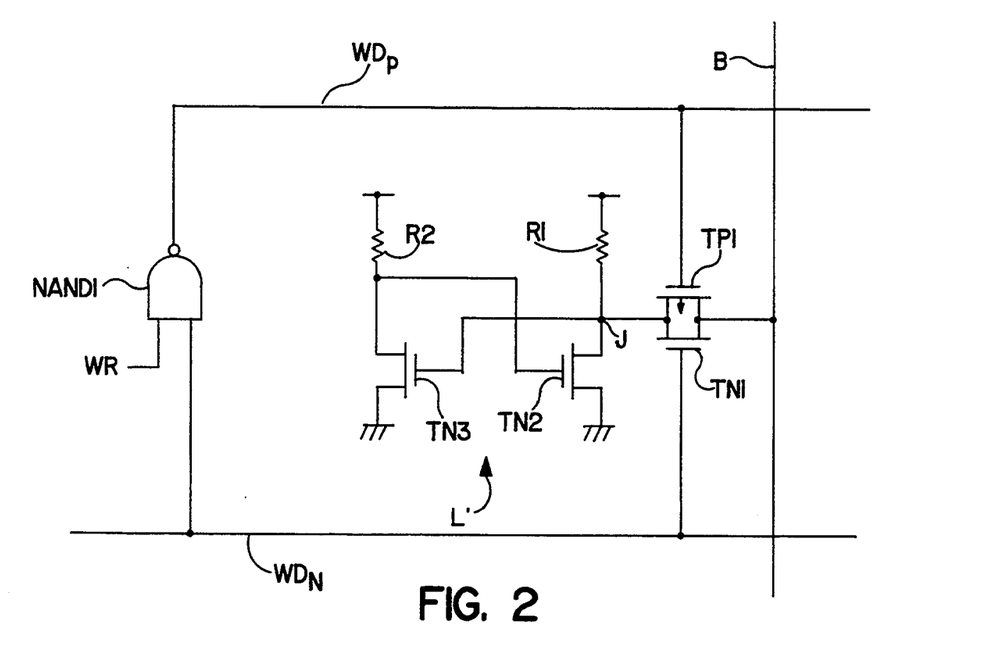
FIG. 2 is a circuit diagram of a modification of the memory cell circuit of FIG. 1.

As shown in FIG. 2, the p-channel MOS transistors TP2 and TP3 each constituting one part of the inverter of the latch portion L may be replaced with high-resistance loads R1 and R2, respectively. The memory cell circuit of this configuration also operates with a small power consumption and provides a large margin for the access operations, thus allowing for mass-production.

Figure 3:
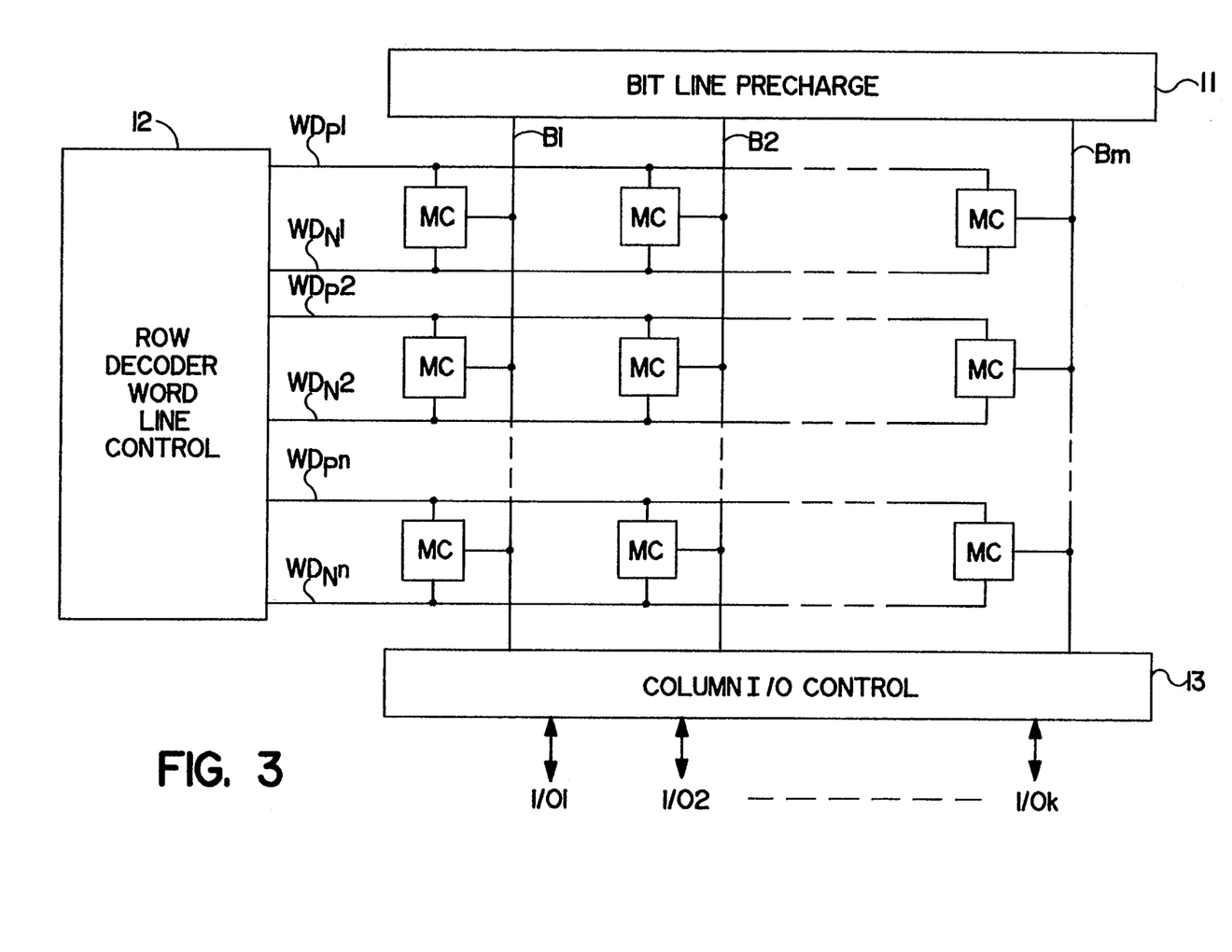
FIG. 3 is a schematic view of a CMOS static RAM using the memory cell circuit of FIG. 1.

FIG. 3 schematically shows a CMOS static RAM using the memory cell circuit of the present invention shown in FIG. 1. The static RAM includes an array of memory cells MC in n rows and m columns, word lines $WD_{N1}$ and $WD_{P1}$, $WD_{N2}$ and $WD_{P2}$, . . . , $WD_{Nn}$ and $WD_{Pn}$ connected to the memory cells MC in respective rows, and bit lines B1, B2, . . . , Bm connected to the memory cells MC in respective columns. The static RAM further includes a bit line precharge circuit 11 for precharging the bit lines B1, B2, . . . , Bm, a row decoder and word line control circuit 12 including the NAND circuit NAND1 shown in FIG. 1, and a column selection and I/O control circuit 13 for connecting the bit lines B1, B2, . . . , Bm with I/O terminals 1/01, 1/02, . . . , I/Ok or sense amplifiers (not shown).

Figure 4:
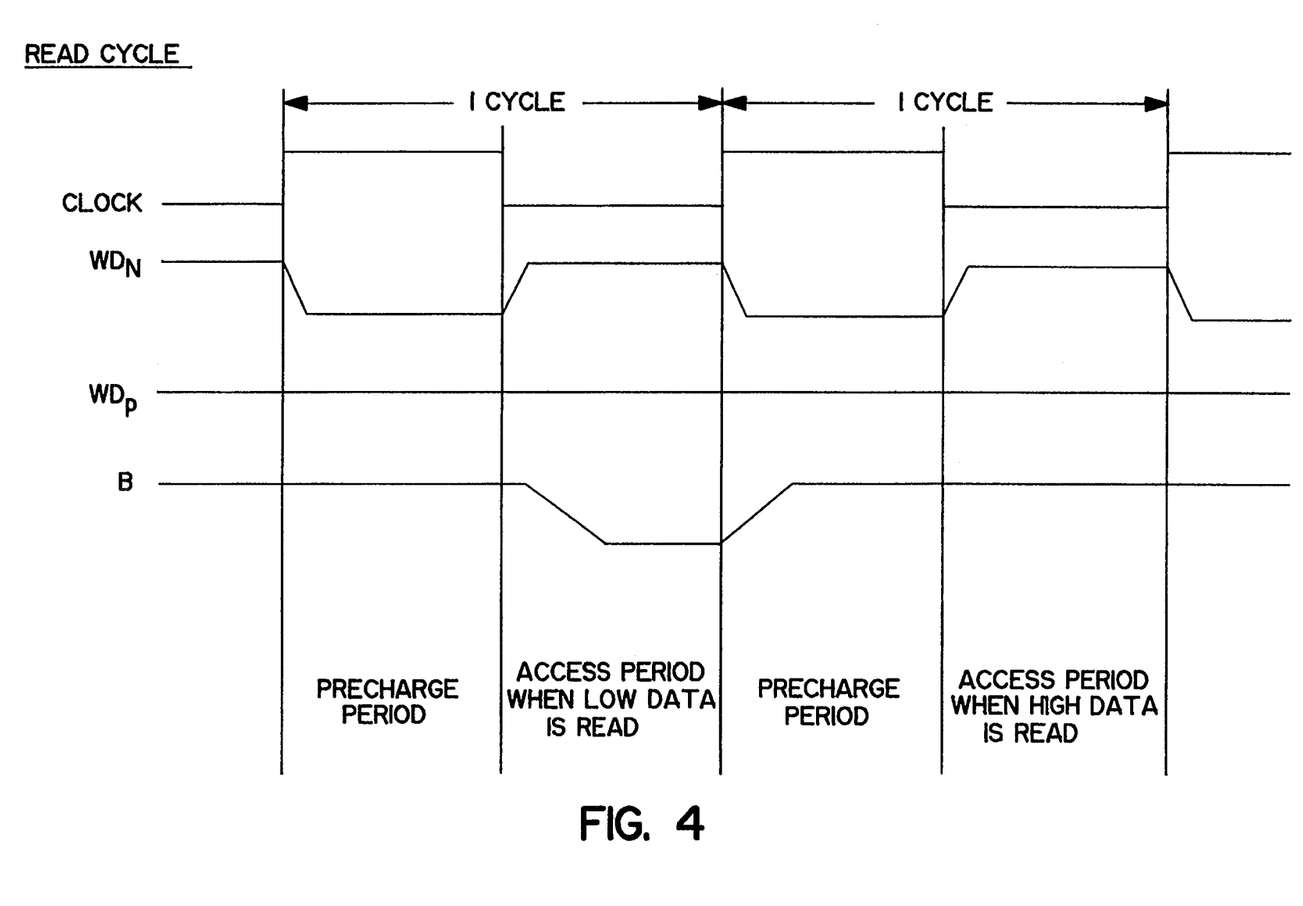
FIG. 4 is a waveform chart showing the read cycle of the static RAM of FIG. 3.
Figure 5:
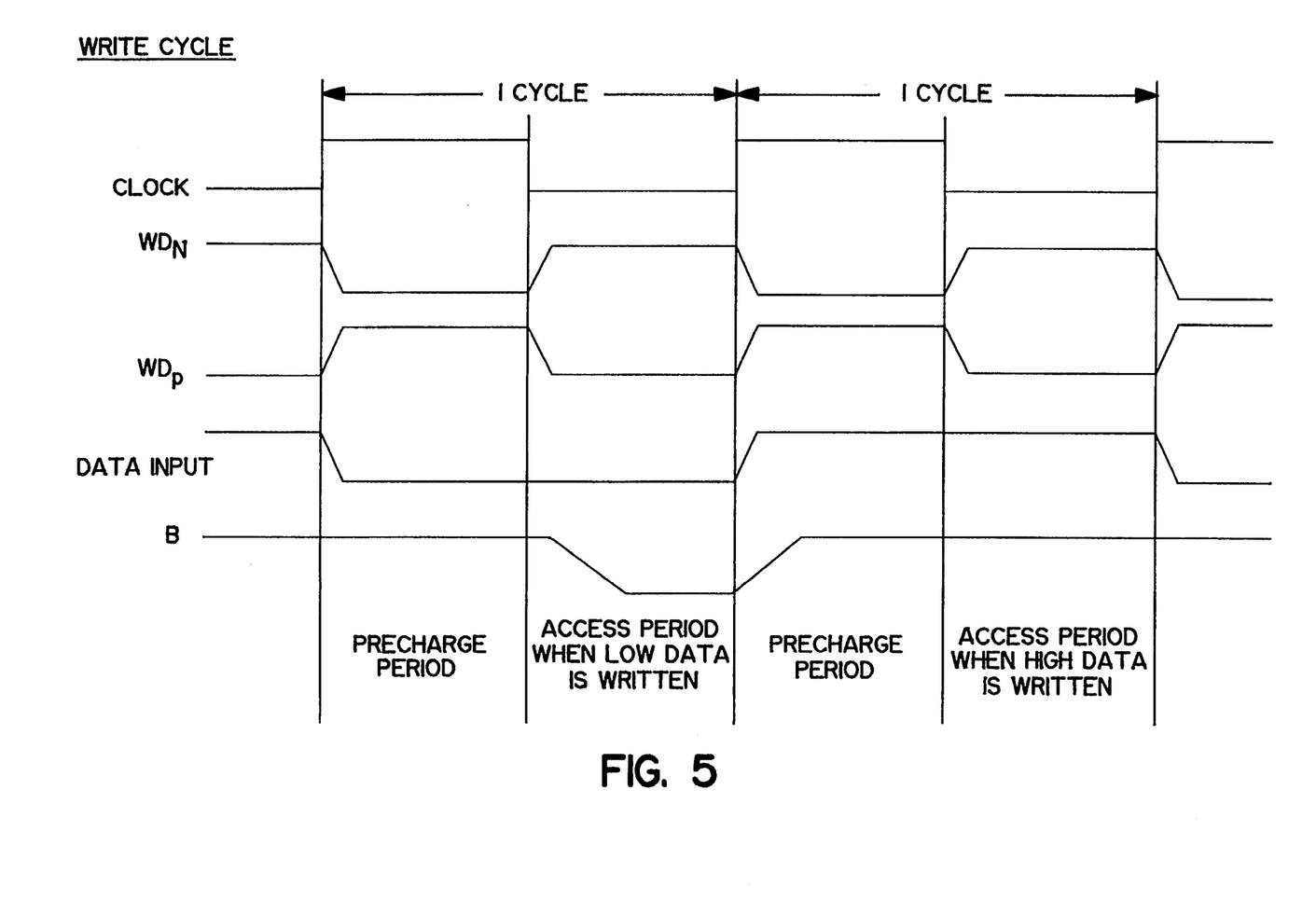
FIG. 5 is a waveform chart showing the write cycle of the static RAM of FIG. 3.

As shown in FIGS. 4 and 5, the static RAM operates at cycles synchronous with a system clock for both the read and write operations. One cycle of these operations includes a precharge period and an access period. In the precharge period of both the read and write cycles, the word lines $WD_N$ and $WD_P$ are not selected, while the bit line B is driven to the HIGH level. In the access period of the read cycle, only the word line $WD_N$ is made active, thereby to read data held in the memory cells MC. In the access period of the write cycle, both the word lines $WD_N$ and $WD_P$ are made active, thereby writing the level of the bit line B to the memory cells MC.

The memory cell circuit of the present invention is also applicable to an asynchronous static RAM without precharging.

Thus, the memory cell circuit of the present invention can solve the problems of the conventional memory cell circuits: (1) Since it is operated with the single bit line, the power consumption of the bit line can be reduced by half compared with a conventional memory cell circuit. (2) The ON resistance of the transfer gates can be reduced by activating both transistors of the transfer gate during the write operation, while one of the transistors is inactivated during the read operation, so that a large margin for the access operations can be ensured. This allows for mass production. (3) Since the number of components can be the same as that for the conventional memory cell circuits, the size can be as small as that of the conventional ones.

Table 2 summarizes the advantages of the memory cell circuit of the present invention over the conventional memory cell circuits.

TABLE 2

| Circuit | Dwg. | Circuit configuration | Characteristics |
|---|---|---|---|
| Conventional Circuit 1 | Fig. 6 | Memory cell: 6 transistors 2 bit lines 1 word line | large power consumption large operating margin |
| Conventional Circuit 2 | Fig. 7 | Memory cell: 5 transistors 1 bit line 1 word line | small power consumption small operating margin, impractical |
| Conventional Circuit 3 | Fig. 8 | Memory cell: 8 transistors 1 bit line 2 word lines 1 control signal line | large chip size small power consumption large operating margin |
| Present invention | Fig. 1 | Memory cell: 6 transistors 1 bit line 2 word lines | small power consumption large operating margin small chip size (Problems of conventional circuits are solved.) |

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A memory cell circuit comprising:
   latch means for holding logic high or logic low data depending on the potential of a single bit line; and
   transfer gate means having a first terminal connected to said latch means and a second terminal connected to said single bit line, said transfer gate means electrically connecting or disconnecting said first terminal and said second terminal in response to a selection signal,
   wherein said transfer gate means includes a first transistor and a second transistor connected in parallel between said first terminal and said second terminal, both of said first transistor and said second transistor being activated during a data write operation, while one of said first transistor and said second transistor being activated during a data read operation.

2. A memory cell circuit according to claim 1, wherein a gate terminal of said first transistor is connected to a first word line conveying a first selection signal, and a gate terminal of said second transistor is connected to a second word line conveying a second selection signal.

3. A memory cell circuit according to claim 2, wherein said second line is connected to an output terminal of a control element for controlling the potential of said second word line, and said control element outputs to said output terminal a signal inverted from said first selection signal as said second selection signal during said data write operation, while said control element outputs to said output terminal a signal not inverted from said first selection signal as said second selection signal during said data read operation.

4. A memory cell circuit according to claim 3, wherein said control element is an NAND element including a first input terminal for receiving a signal indicating the mode of said data write operation or said data read operation and a second input terminal connected to said first word line.

5. A memory cell circuit according to claim 4, wherein said first transistor is a first n-channel MOS transistor, and said second transistor is a first p-channel MOS transistor.

6. A memory cell circuit according to claim 5, wherein said latch means includes a first inverter and a second inverter, an input terminal of said first inverter and an output terminal of said second inverter are connected with each other, an input terminal of said second inverter and an output terminal of said first inverter are connected with each other, and said output terminal of said first inverter is connected with said first terminal of said transfer gate.

7. A memory cell circuit according to claim 6, wherein said first inverter includes a second p-channel MOS transistor disposed between said output terminal of said first inverter and a high-potential source and a second n-channel MOS transistor disposed between said output terminal and a low-potential source, and said second inverter includes a third p-channel MOS transistor disposed between said output terminal of said second inverter and said high-potential source and a third n-channel MOS transistor disposed between said output terminal and said low-potential source.

8. A memory cell circuit according to claim 7, wherein said high-potential source is a power source supplying a logic high potential, and said low-potential source is a power source supplying a logic low potential.

9. A memory cell circuit according to claim 6, wherein said first inverter includes a first resistance disposed between said output terminal of said first inverter and a high-potential source and a second n-channel MOS transistor disposed between said output terminal and a low-potential source, and said second inverter includes a second resistance disposed between said output terminal of said second inverter and said high-potential source and a third n-channel MOS transistor disposed between said output terminal and said low-potential source.

10. A memory cell circuit according to claim 9, wherein said high-potential source is a power source supplying a logic high potential, and said low-potential source is a power source supplying a logic low potential.

11. A memory cell circuit according to claim 1, wherein said latch means includes a first inverter and a second inverter, an input terminal of said first inverter and an output terminal of said second inverter are connected with each other, an input terminal of said second inverter and an output terminal of said first inverter are connected with each other, and said output terminal of said first inverter is connected with said first terminal of said transfer gate.

12. A memory cell circuit according to claim 11, wherein said first inverter includes a second p-channel MOS transistor disposed between said output terminal of said first inverter and a high-potential source and a second n-channel MOS transistor disposed between said output terminal and a low-potential source, and said second inverter includes a third p-channel MOS transistor disposed between said output terminal of said second inverter and said high-potential source and a third n-channel MOS transistor disposed between said output terminal and said low-potential source.

13. A memory cell circuit according to claim 12, wherein said high-potential source is a power source supplying a logic high potential, and said low-potential source is a power source supplying a logic low potential.

14. A memory cell circuit according to claim 11, wherein said first inverter includes a first resistance disposed between said output terminal of said first inverter and a high-potential source and a second n-channel MOS transistor disposed between said output terminal and a low-potential source, and said second inverter includes a second resistance disposed between said output terminal of said second inverter and said high-potential source and a third n-channel MOS transistor disposed between said output terminal and said low-potential source.

15. A memory cell circuit according to claim 14, wherein said high-potential source is a power source supplying a logic high potential, and said low-potential source is a power source supplying a logic low potential.

* * * * *

UNITED STATES PATENT AND TRADEMARK OFFICE
CERTIFICATE OF CORRECTION

PATENT NO.  : 5,353,251
DATED       : October 4, 1994
INVENTOR(S) : Munehiro Uratani, et al.

It is certified that error appears in the above-indentified patent and that said Letters Patent is hereby corrected as shown below:

Column 6, line 1: "1/01, 1/02" should read --I/01, I/02--;

Column 7, line 25: "second line" should read --second word line--.

Signed and Sealed this

Third Day of January, 1995

Attest:

BRUCE LEHMAN

*Attesting Officer*    *Commissioner of Patents and Trademarks*